United States Patent
Doczy et al.

(10) Patent No.: US 7,148,548 B2
(45) Date of Patent: Dec. 12, 2006

(54) SEMICONDUCTOR DEVICE WITH A HIGH-K GATE DIELECTRIC AND A METAL GATE ELECTRODE

(75) Inventors: Mark L. Doczy, Beaverton, OR (US); Jack Kavalieros, Portland, OR (US); Matthew V. Metz, Hillsboro, OR (US); Justin K. Brask, Portland, OR (US); Suman Datta, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/896,124

(22) Filed: Jul. 20, 2004

(65) Prior Publication Data
US 2006/0017098 A1 Jan. 26, 2006

(51) Int. Cl.
*H01L 29/76* (2006.01)
(52) U.S. Cl. .............. 257/407; 257/250; 257/412; 257/388; 257/410; 257/E29.134
(58) Field of Classification Search .............. None
See application file for complete search history.

(56) References Cited

U.S. PATENT DOCUMENTS

| | | | |
|---|---|---|---|
| 5,858,843 A | 1/1999 | Doyle et al. | |
| 6,063,698 A | 5/2000 | Tseng et al. | 438/585 |
| 6,083,836 A * | 7/2000 | Rodder | 438/690 |
| 6,184,072 B1 | 2/2001 | Kaushik et al. | 438/197 |
| 6,255,698 B1 | 7/2001 | Gardner et al. | 257/369 |
| 6,365,450 B1 * | 4/2002 | Kim | 438/216 |
| 6,410,376 B1 | 6/2002 | Ng et al. | 438/199 |
| 6,544,906 B1 | 6/2002 | Rotondaro et al. | 438/785 |
| 6,420,279 B1 | 7/2002 | Ono et al. | 438/785 |
| 6,475,874 B1 | 8/2002 | Xiang et al. | 438/396 |
| 6,514,828 B1 | 10/2002 | Ahn et al. | 438/240 |
| 6,586,288 B1 | 7/2003 | Kim et al. | 438/183 |
| 6,617,209 B1 | 8/2003 | Chau et al. | 438/240 |
| 6,617,210 B1 | 9/2003 | Chau et al. | 438/240 |
| 6,620,713 B1 | 9/2003 | Arghavani et al. | 438/585 |
| 6,689,675 B1 | 2/2004 | Parker et al. | 438/585 |
| 6,696,327 B1 | 2/2004 | Brask et al. | 438/197 |
| 6,696,345 B1 | 2/2004 | Chau et al. | 438/387 |
| 6,709,911 B1 | 3/2004 | Doczy et al. | 438/197 |
| 6,716,707 B1 | 4/2004 | Brask et al. | 438/287 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2004/0169238 A1 * | 9/2004 | Lee et al. | 257/406 |

(Continued)

FOREIGN PATENT DOCUMENTS

EP  0 899 784 AZ  3/1999

(Continued)

OTHER PUBLICATIONS http://www.reade.com/Products/Aluminides/titanium_aluminide.htm, Materials Data Sheet for titanium aluminide.*

(Continued)

*Primary Examiner*—Nathan J. Flynn
*Assistant Examiner*—Scott R. Wilson
(74) *Attorney, Agent, or Firm*—Rahul D. Engineer

(57) ABSTRACT

A semiconductor device is described that comprises a gate dielectric and a metal gate electrode that comprises an aluminide.

27 Claims, 3 Drawing Sheets

U.S. PATENT DOCUMENTS

2005/0106797 A1* 5/2005 Colombo .................... 438/197

FOREIGN PATENT DOCUMENTS

GB          2 358 737 A      4/2001

OTHER PUBLICATIONS

Hartmann et al., "Ruthenium oxide and strontium ruthenate electrodes for ferroelectric thin-films capacitors", Jan. 2000, Springer-Verlag, Appl. Phys. A 70, 239-242.*

Polishchuk et al., "Dual Workfunction CMOS Gate Technology Based on Metal Interdiffucion", www.eesc.berkeley.edu, 1 page.

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance improvement of Metal Gate CMOS Technologies with Gigabit Feature Sizes", Technical University of Hanburg-Harburg, 5 pages.

Doczy et al., "Integrating N-type and P-type Metal Gate Transisors," Serial No. 10/327,293, Filed Dec. 20, 2002.

Brask et al., "A Method for Making a Semiconductor Device that Includes a Metal Gate Electrode," U.S. Appl. No. 10/739,173, Filed Dec. 18, 2003.

Brask et al., "A CMOS Device with Metal and Silicide Gate Electrodes and a Method for Making it", U.S. Appl. No. 10/748,559, Filed Dec. 29, 2003.

Brask et al., "A Method for Making a Semiconductor Device with a Metal Gate Electrode that is Formed on an Annealed High-K Gate Dielectric layer", U.S. Appl. No. 10/742,678, Filed Dec. 19, 2003.

Doczy et al., "A Method for Making a Semiconductor Device that Includes a Metal Gate Electrode", U.S. Appl. No. 10/748,545, Filed Dec. 29, 2003.

Shah et al., "A Replacement Gate Process for Making a Semiconductor Device that Includes a Metal Gate Electrode," U.S. Appl. No. 10/809,853, Filed March 24, 2004.

PCT/US2005/024489 Search Report & Written Opinion; dated Nov. 10, 2006.

* cited by examiner

SEMICONDUCTOR DEVICE WITH A HIGH-K GATE DIELECTRIC AND A METAL GATE ELECTRODE

FIELD OF THE INVENTION

The present invention relates to semiconductor devices, in particular, those that include high-k gate dielectrics and metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics. Certain metals with a workfunction below 4.3 eV may be used to make metal gate electrodes for NMOS transistors. Those metals, however, may be thermally unstable at temperatures above 400° C., causing them to react adversely with high-k gate dielectrics.

Accordingly, there is a need for a semiconductor device with a high-k gate dielectric, and an NMOS metal gate electrode with a workfunction below 4.3 eV that is thermally stable at 400° C. The present invention provides such a semiconductor device.

Figure 1A:
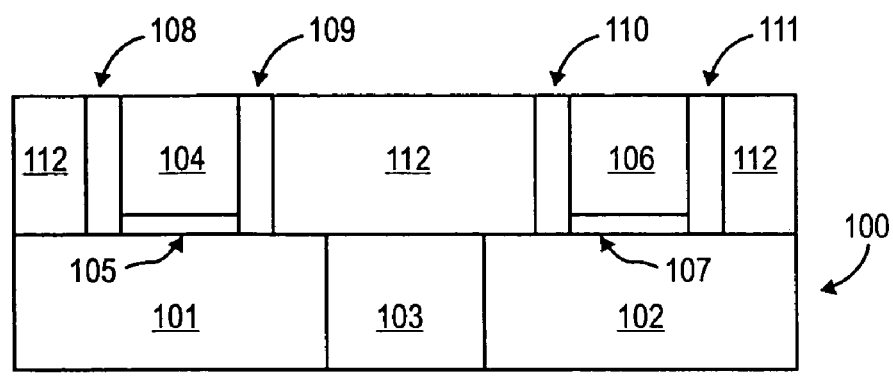
FIGS. 1a–1i represent cross-sections of structures that may be formed when carrying out an embodiment of a replacement gate method that may be used to make the semiconductor device of the present invention.

Features shown in these figures are not intended to be drawn to scale.

DETAILED DESCRIPTION OF THE PRESENT INVENTION

A semiconductor device is described. That semiconductor device comprises a gate dielectric and a metal gate electrode that comprises an aluminide. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

One embodiment of the present invention comprises a high-k gate dielectric upon which is formed an NMOS metal gate electrode that comprises an aluminide. The high-k gate dielectric may comprise hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form such a high-k gate dielectric are described here, that dielectric may be made from other materials that serve to reduce gate leakage.

The aluminide, from which the NMOS metal gate electrode is made, is an ordered intermetallic alloy. The atomic arrangement of such an alloy differs from the atomic arrangement of conventional metal alloys. Unlike conventional aluminum alloys, the alloying atoms in an aluminide are arranged periodically, forming a superlattice crystal structure, when maintained below the critical ordering temperature. When compared to conventional aluminum alloys, aluminides may show enhanced structural stability and resistance to high temperature deformation.

In preferred embodiments of the semiconductor device of the present invention, the aluminide has the composition $M_xAl_y$, in which M is a transition metal, and the ratio of x to y represents the relative atomic percentage of the transition metal to the aluminum that is contained in the aluminide. Aluminides with that composition may, for example, include zirconium, tungsten, tantalum, hafnium, titanium, and other transition metals that yield a composition with the desired workfunction and thermal stability, when combined with aluminum. The aluminide included in the semiconductor of the present invention may also include multiple transition metals that are bound within a superlattice crystal structure with an aluminum alloy, e.g., an alloy that includes aluminum doped with relatively small quantities of boron or magnesium.

When used to form an NMOS metal gate electrode, such aluminides preferably have the composition $M_xAl_y$, wherein x is between 1 and 4 and y is between 1 and 4. Particularly preferred aluminides for making NMOS metal gate electrodes include $ZrAl$, $ZrAl_2$, $ZrAl_3$, $WAl_4$, $TaAl$, $HfAl$, $TiAl$, $TiAl_2$, $TiAl_3$, and $Ti_3Al$. The resulting NMOS metal gate electrode may have a workfunction that is less than 4.3 eV, and that is preferably between about 3.9 eV and about 4.3 eV, and more preferably between about 4.0 eV and about 4.2 eV.

The aluminide, from which the NMOS metal gate electrode is formed, should be thick enough to ensure that any material formed on it will not significantly impact its workfunction. Preferably, such an aluminide is between about 20 angstroms and about 2,000 angstroms thick, and more preferably is between about 100 angstroms and about 300 angstroms thick. Such an NMOS metal gate electrode preferably is thermally stable at 400° C.

When the semiconductor of the present invention is a CMOS device, it may include a PMOS metal gate electrode, which does not comprise an aluminide, in addition to the NMOS metal gate electrode, which does comprise an aluminide. Such a PMOS metal gate electrode may be formed on a high-k gate dielectric, and may comprise a p-type metal such as ruthenium, palladium, platinum, cobalt, nickel, or a conductive metal oxide, e.g., ruthenium oxide. Although a few examples of metals that may be used to form p-type metal layers are described here, such layers may be made from many other materials.

When used to form a PMOS metal gate electrode, such p-type metals preferably have a workfunction that is between about 4.9 eV and about 5.2 eV. They are preferably between about 20 angstroms and about 2,000 angstroms thick, and are more preferably between about 100 angstroms and about 300 angstroms thick. Like the aluminides for making the NMOS metal gate electrode, the p-type metals used to make the PMOS metal gate electrode should be thermally stable at 400° C.

FIGS. 1a–1i illustrate structures that may be formed, when carrying out an embodiment of a replacement gate method that may be used to make the semiconductor device of the present invention. FIG. 1a represents an intermediate structure that may be formed when making a CMOS device. That structure includes first part 101 and second part 102 of substrate 100. Isolation region 103 separates first part 101 from second part 102. First polysilicon layer 104 is formed on dielectric layer 105, and second polysilicon layer 106 is formed on dielectric layer 107. First polysilicon layer 104 is bracketed by sidewall spacers 108 and 109, and second polysilicon layer 106 is bracketed by sidewall spacers 110 and 111. Dielectric layer 112 separates layers 104 and 106.

Substrate 100 may comprise any material that may serve as a foundation upon which a semiconductor device may be built. Isolation region 103 may comprise silicon dioxide, or other materials that may separate the transistor's active regions. Dielectric layers 105 and 107 may each comprise silicon dioxide, or other materials that may insulate the substrate from other substances. In this embodiment, first polysilicon layer 104 is doped n-type, and second polysilicon layer 106 is doped p-type. First and second polysilicon layers 104 and 106 may be between about 100 and about 2,000 angstroms thick, and preferably are between about 500 and about 1,600 angstroms thick. Spacers 108, 109, 110, and 111 preferably comprise silicon nitride, while dielectric layer 112 may comprise silicon dioxide or a low-k material.

Conventional process steps, materials, and equipment may be used to generate the FIG. 1a structure, as will be apparent to those skilled in the art. As shown, dielectric layer 112 may be polished back, e.g., via a conventional chemical mechanical polishing ("CMP") step, to expose first and second polysilicon layers 104 and 106. Although not shown, the FIG. 1a structure may include many other features (e.g., a silicon nitride etch stop layer, source and drain regions, and one or more buffer layers) that may be formed using conventional processes.

When source and drain regions are formed using conventional ion implantation and anneal processes, it may be desirable to form a hard mask on polysilicon layers 104 and 106—and an etch stop layer on the hard mask—to protect layers 104 and 106 when the source and drain regions are covered with a silicide. Such a hard mask may comprise silicon nitride. Such an etch stop layer may comprise silicon, an oxide (e.g., silicon dioxide or hafnium dioxide), or a carbide (e.g., silicon carbide).

Such an etch stop layer and silicon nitride hard mask may be polished from the surface of layers 104 and 106, when dielectric layer 112 is polished—as those layers will have served their purpose by that stage in the process. FIG. 1a represents a structure in which any hard mask or etch stop layer, which may have been previously formed on layers 104 and 106, has already been removed from the surface of those layers. When ion implantation processes are used to form the source and drain regions, layers 104 and 106 may be doped at the same time the source and drain regions are implanted.

After forming the FIG. 1a structure, first polysilicon layer 104 is removed. In a preferred embodiment, that layer is removed by exposing it to an aqueous solution that comprises between about 2% and about 30% ammonium hydroxide by volume for a sufficient time at a sufficient temperature to remove substantially all of layer 104 without removing a significant amount of second polysilicon layer 106. During that exposure step, it may be desirable to apply sonic energy at a frequency of between about 10 KHz and about 2,000 KHz, while dissipating at between about 1 and about 10 watts/cm². As an example, if n-type polysilicon layer 104 is about 1,350 angstroms thick, it may be removed by exposing it at about 25° C. for about 30 minutes to a solution that comprises about 15 percent ammonium hydroxide by volume in deionized water, while applying sonic energy at about 1,000 KHz—dissipating at about 5 watts/cm².

Figure 1B:
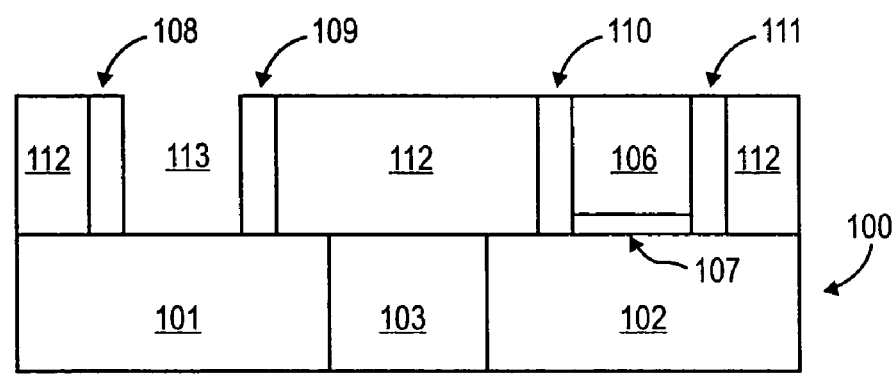

After removing first polysilicon layer 104, dielectric layer 105 is removed. When dielectric layer 105 comprises silicon dioxide, it may be removed using an etch process that is selective for silicon dioxide. Such an etch process may comprise exposing layer 105 to a solution that includes about 1 percent HF in deionized water. The time layer 105 is exposed should be limited, as the etch process for removing that layer may also remove part of dielectric layer 112. With that in mind, if a 1 percent HF based solution is used to remove layer 105, the device preferably should be exposed to that solution for less than about 60 seconds, and more preferably for about 30 seconds or less. As shown in FIG. 1b, removal of dielectric layer 105 forms trench 113 within dielectric layer 112 positioned between sidewall spacers 108 and 109.

After removing dielectric layer 105, high-k gate dielectric 115, which may comprise one of the materials specified above, is formed within trench 113 and on substrate 100. High-k gate dielectric 115 may be formed on substrate 100 using a conventional atomic layer chemical vapor deposition ("CVD") process. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric 115. The CVD reactor should be operated long enough to form a dielectric with the desired thickness. In most applications, high-k gate dielectric 115 should be less than about 60 angstroms thick, and more preferably between about 5 angstroms and about 40 angstroms thick.

Figure 1C:
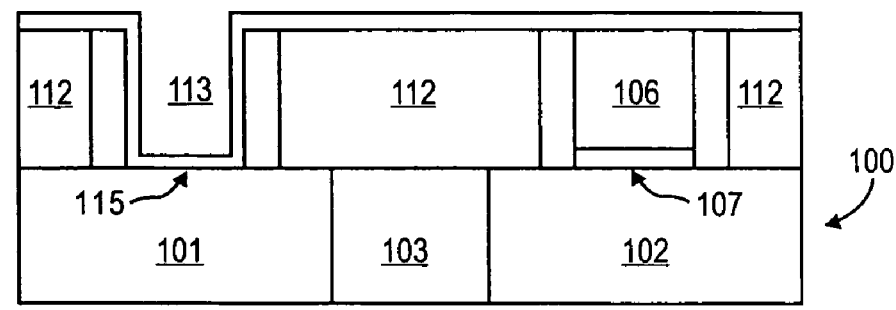

As shown in FIG. 1c, when an atomic layer CVD process is used to form high-k gate dielectric 115, that dielectric will form on the sides of trench 113 in addition to forming on the bottom of that trench, and will form on dielectric layer 112. If high-k gate dielectric 115 comprises an oxide, it may manifest oxygen vacancies at random surface sites and unacceptable impurity levels, depending upon the process used to make it. After dielectric 115 is deposited, it may be desirable to remove impurities from that dielectric, and to oxidize it to generate a dielectric with a nearly idealized metal:oxygen stoichiometry.

To remove impurities from high-k gate dielectric 115 and to increase that dielectric's oxygen content, high-k gate dielectric 115 may be exposed to an aqueous solution that contains between about 2% and about 30% hydrogen peroxide by volume. In a particularly preferred embodiment, high-k gate dielectric 115 is exposed to an aqueous solution that contains about 6.7% $H_2O_2$ by volume for about 10 minutes at a temperature of about 25° C. During that exposure step, it may be desirable to apply sonic energy at a frequency of about 1,000 KHz, while dissipating at about 5 watts/cm².

Figure 1D:
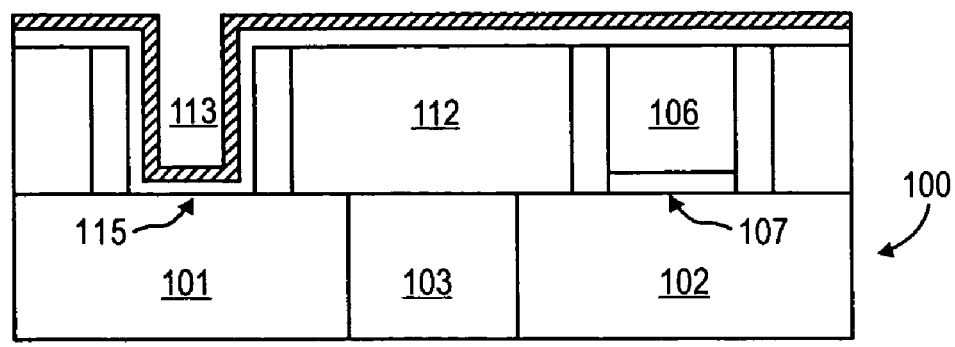

In the illustrated embodiment, first metal layer 116 is formed directly on high-k gate dielectric 115 to generate the FIG. 1d structure. Like high-k gate dielectric 115, part of first metal layer 116 lines trench 113 while part of that layer spills over onto dielectric layer 112. As indicated above, first metal layer 116 comprises an aluminide, preferably one with the composition $M_xAl_y$, in which M is a transition metal. Such an aluminide may be formed on high-k gate dielectric 115 using a conventional physical vapor deposition ("PVD") process. In such a process, an alloy target (or multiple pure targets) may be sputtered onto high-k gate dielectric 115. Alternatively, an aluminide may be formed using a CVD process that employs multiple precursors. In addition, nanolaminate techniques (which rely upon PVD, CVD, or atomic layer CVD processes) may be used to alternately deposit ultra-thin aluminum and transition metal layers, which will crystallize in the desired manner to form aluminide 116.

Figure 1E:
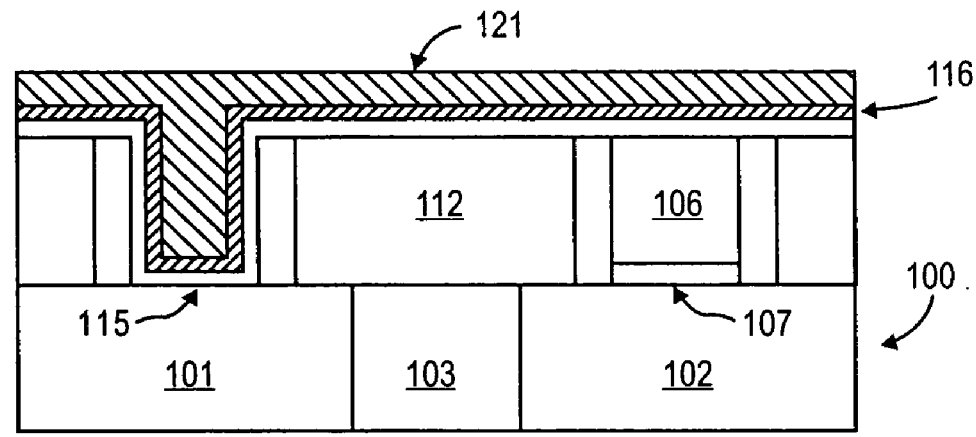

In this embodiment, after forming first metal layer 116 on high-k gate dielectric 115, second metal layer 121 is formed on first metal layer 116. Second metal layer 121 fills the remainder of trench 113 and covers dielectric layer 112, as illustrated in FIG. 1e. Second metal layer 121 preferably comprises a material that may be easily polished, and preferably is deposited over the entire device using a conventional metal deposition process. Such a fill metal may comprise titanium nitride, tungsten, titanium, aluminum, tantalum, tantalum nitride, cobalt, copper, nickel, or any other metal that may be polished and that may satisfactorily fill trench 113. When a fill metal covers first metal layer 116, first metal layer 116 preferably is between about 20 angstroms and about 300 angstroms thick, and more preferably is between about 25 angstroms and about 200 angstroms thick. When a fill metal does not cover aluminide 116, e.g., when the aluminide completely fills trench 113, first metal layer 116 may be up to 2,000 angstroms thick. As mentioned above, first metal layer 116 preferably has a workfunction that is between about 3.9 eV and about 4.3 eV.

Figure 1F:
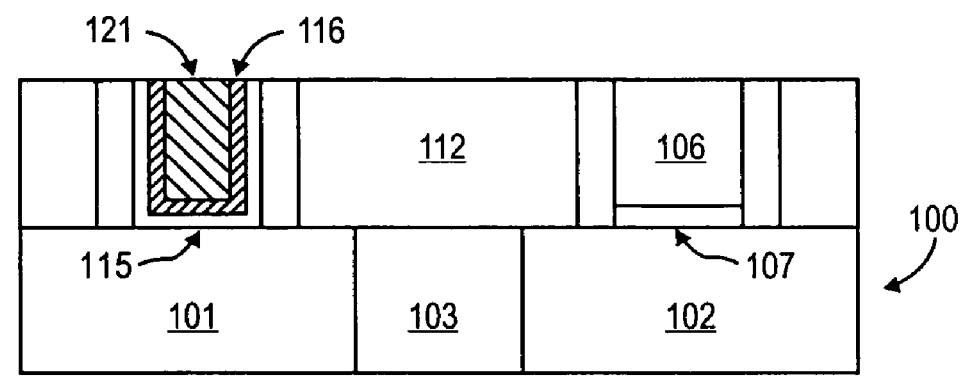

After forming the FIG. 1e structure, second metal layer 121, first metal layer 116, and high-k gate dielectric 115 are removed from above dielectric layer 112 to generate the FIG. 1f structure. A CMP step may be applied to remove those materials from above dielectric layer 112. Alternatively, a CMP step may be used to remove second metal layer 121, while a subsequent dry etch step (and, optionally, an additional wet etch step) is applied to remove first metal layer 116 and high-k gate dielectric 115 from above dielectric layer 112.

After second metal layer 121, first metal layer 116 and high-k gate dielectric 115 are removed from above dielectric layer 112, p-type polysilicon layer 106 is removed. Layer 106 may be removed selectively to second metal layer 121 by exposing it to a solution that comprises between about 20 and about 30 percent TMAH by volume in deionized water for a sufficient time at a sufficient temperature (e.g., between about 60° C. and about 90° C.), while applying sonic energy.

Figure 1G:
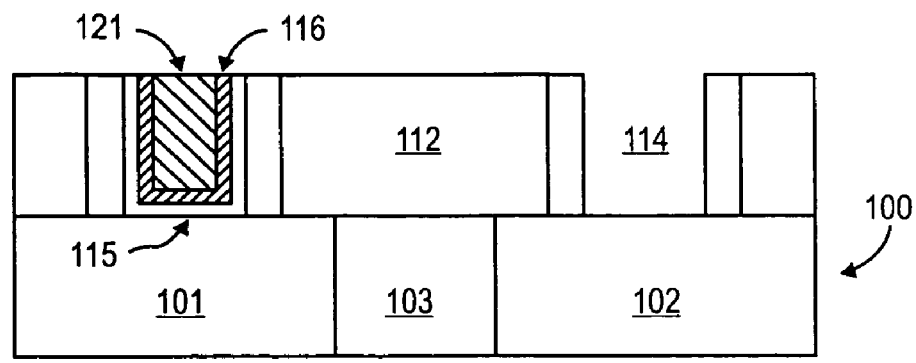

After removing second polysilicon layer 106, dielectric layer 107 is removed, e.g., by using the same process that was used to remove dielectric layer 105. Removing dielectric layer 107 generates trench 114, as FIG. 1g illustrates. Following the removal of that dielectric layer, high-k gate dielectric 117 is formed within trench 114 and onto dielectric layer 112. The same process steps and materials used to form high-k gate dielectric 115 may be used to form high-k gate dielectric 117.

In this embodiment, third metal layer 120 is then deposited on high-k gate dielectric 117. Third metal layer 120 may comprise one of the p-type metals identified above, and may be formed on high-k gate dielectric 117 using a conventional PVD or CVD process. In this embodiment, third metal layer 120 preferably is between about 20 angstroms and about 300 angstroms thick, and more preferably is between about 25 angstroms and about 200 angstroms thick. Third metal layer 120 may have a workfunction that is between about 4.9 eV and about 5.2 eV.

Figure 1H:
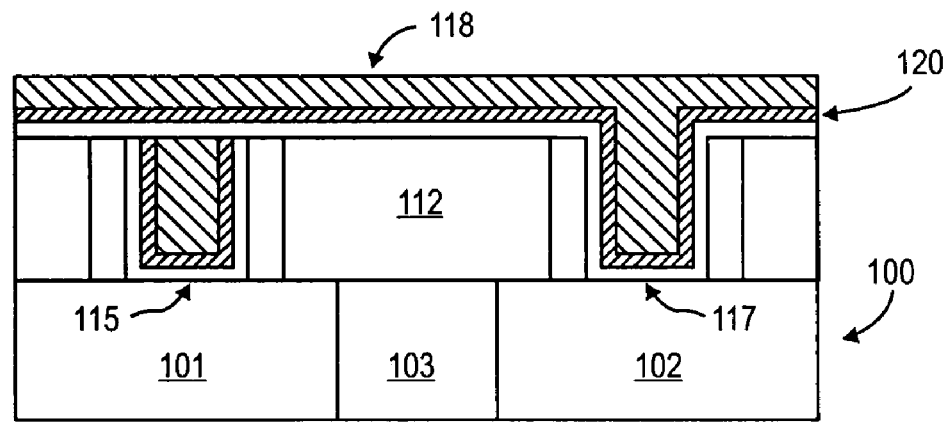
Figure 1I:
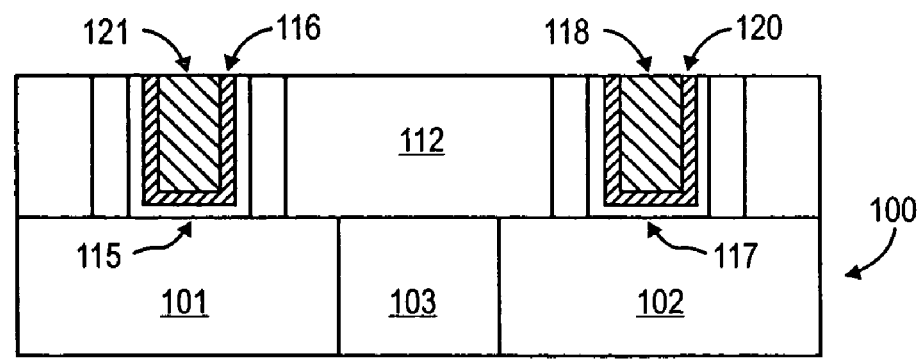

After forming third metal layer 120 on high-k gate dielectric 117, fourth metal layer 118, e.g., a second fill metal, may be formed on third metal layer 120 to generate the FIG. 1h structure. The same process steps and materials used to form second metal layer 121 may be used to form fourth metal layer 118. The portions of fourth metal layer 118, third metal layer 120 and high-k gate dielectric 117 that cover dielectric layer 112 may then be removed to generate the FIG. 1i structure. The same CMP and/or etch steps used to remove first fill metal 121, aluminide 116 and high-k gate dielectric 115 from above dielectric layer 112 may be used to remove second fill metal 118, third metal layer 120 and high-k gate dielectric 117 from above dielectric layer 112.

After removing fourth metal layer 118, third metal layer 120 and high-k gate dielectric 117 from above dielectric layer 112, a capping dielectric layer (not shown) may be deposited onto the resulting structure using a conventional deposition process. Process steps for completing the device that follow the deposition of such a capping dielectric layer, e.g., forming the device's contacts, metal interconnect, and passivation layer, are well known to those skilled in the art and will not be described here.

The semiconductor device of the present invention includes an NMOS metal gate electrode that has a workfunction that is below 4.3 eV and that is thermally stable at 400° C. Such a metal gate electrode may provide an NMOS transistor with structural and temperature stability properties that render it suitable for high volume manufacturing of semiconductor devices.

Although the foregoing description has specified certain materials that may be used to create the semiconductor device of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A semiconductor device comprising:
   a high-k gate dielectric that comprises a material selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate;
   a metal gate electrode, which is formed on the gate dielectric, that comprises an aluminide with the composition $M_xAl_y$ where M is a transition metal, and
   a fill metal that is formed on the aluminide.

2. The semiconductor device of claim 1 wherein M comprises an element that is selected from the group consisting of zirconium, tungsten, tantalum, hafnium, and titanium.

3. The semiconductor device of claim 1 wherein the metal gate electrode has a workfunction that is less than about 4.3 eV.

4. The semiconductor device of claim 1 wherein the metal gate electrode is thermally stable at 400° C.

5. A CMOS semiconductor device comprising:
   a high-k gate dielectric that comprises a material selected from the group consisting of hafnium oxide, zirconium oxide, and aluminum oxide;
   an NMOS metal gate electrode that comprises an aluminide with the composition $M_xAl_y$ in which M comprises an element selected from the group consisting of zirconium, tungsten, tantalum, hafnium, and titanium, and a fill metal that is formed on the alumide; and a PMOS metal gate electrode that comprises a material selected from the group consisting of ruthenium, palladium, platinum, cobalt, nickel, and a conductive metal oxide.

6. The CMOS semiconductor device of claim 5 wherein the NMOS metal gate electrode has a workfunction that is between about 3.9 eV and about 4.3 eV, and the PMOS metal gate electrode has a workfunction that is between about 4.9 eV and about 5.2 eV.

7. The CMOS semiconductor device of claim 5 wherein the aluminide has the composition $M_xAl_y$, in which, x is between 1 and 4 and y is between 1 and 4.

8. The CMOS semiconductor device of claim 7 wherein the aluminide is selected from the group consisting of ZrAl, $ZrAl_2$, $ZrAl_3$, $WAl_4$, TaAl, HfAl, TiAl, $TiAl_2$, $TiAl_3$, and $Ti_3Al$.

9. The CMOS semiconductor device of claim 5 wherein the fill metal is selected from the group consisting of titanium nitride, tungsten, titanium, aluminum, tantalum, tantalum nitride, cobalt, copper, and nickel.

10. The CMOS semiconductor device of claim 5 wherein:
the high-k gate dielectric is formed using an atomic layer chemical vapor deposition process and is between about 5 angstroms and about 40 angstroms thick, and
the aluminide is between about 100 angstroms and about 300 angstroms thick.

11. The CMOS semiconductor device of claim 5 wherein both the NMOS metal gate electrode and the PMOS metal gate electrode are thermally stable at 400° C.

12. A semiconductor device comprising:
a high-k gate dielectric that comprises a material selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate; and
an NMOS metal gate electrode that comprises an aluminide with the composition $M_xAl_y$, wherein M is a transition metal that is selected from the group consisting of zirconium, tungsten, tantalum, titanium, and hafnium.

13. The semiconductor device of claim 12, wherein the aluminide is selected from the group consisting of ZrAl, $ZrAl_2$, $ZrAl_3$, $WAl_4$, TaAl, and HfAl.

14. The semiconductor device of claim 12, further comprising a fill metal that is formed on the aluminide.

15. The semiconductor device of claim 14, wherein the fill metal is selected from the group consisting of titanium nitride, tungsten, titanium, aluminum, tantalum, tantalum nitride, cobalt, copper, and nickel.

16. The semiconductor device of claim 12, wherein the NMOS metal gate electrode has a workfunction that is between about 3.9 eV and about 4.3 eV, and is thermally stable at 400° C.

17. A semiconductor device comprising:
a high-k gate dielectric, wherein the high-k gate dielectric is formed using an atomic layer chemical vapor deposition process and is between about 5 angstroms and about 40 angstroms thick; and
an NMOS metal gate electrode that comprises an aluminide with the composition $M_xAl_y$, in which M is a transition metal, wherein the aluminide is between about 100 angstroms and about 300 angstroms thick.

18. The semiconductor device of claim 17 wherein:
the high-k gate dielectric comprises a material that is selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate; and
M comprises an element that is selected from the group consisting of zirconium, tungsten, tantalum, hafnium, and titanium.

19. The semiconductor device of claim 17, further comprising a PMOS metal gate electrode that does not comprise an aluminide.

20. The semiconductor device of claim 19, wherein the PMOS metal gate electrode comprises a material that is selected from the group consisting of ruthenium, palladium, platinum, cobalt, nickel, and a conductive metal oxide.

21. The semiconductor device of claim 19, further comprising a fill metal that is formed on the aluminide.

22. The semiconductor device of claim 17, wherein the aluminide has the composition $M_xAl_y$, in which M is a transition metal, x is between 1 and 4, and y is between 1 and 4.

23. The semiconductor device of claim 17, wherein the aluminide is selected from the group consisting of ZrAl, $ZrAl_2$, $ZrAl_3$, $WAl_4$, TaAl, HfAl, TiAl, $TiAl_2$, $TiAl_3$, and $Ti_3Al$.

24. A CMOS semiconductor device comprising:
a high-k gate dielectric;
an NMOS metal gate electrode that comprises an aluminide and a fill metal formed on the aluminide, wherein the aluminide has the composition $M_xAl_y$ in which M is a transition metal, and wherein the NMOS metal gate electrode has a workfunction that is between about 3.9 eV and about 4.3 eV; and
a PMOS metal gate electrode that does not comprise an aluminide, wherein the PMOS metal gate electrode has a workfunction that is between about 4.9 eV and about 5.2 eV.

25. The CMOS semiconductor device of claim 24 wherein the aluminide has the composition $M_xAl_y$, in which x is between 1 and 4 and y is between 1 and 4.

26. The CMOS semiconductor device of claim 24 wherein the aluminide is selected from the group consisting of ZrAl, $ZrAl_2$, $ZrAl_3$, $WAl_4$, TaAl, HfAl, TiAl, $TiAl_2$, $TiAl_3$, and $Ti_3Al$.

27. The CMOS semiconductor device of claim 24, wherein the fill metal is selected from the group consisting of titanium nitride, tungsten, titanium, aluminum, tantalum, tantalum nitride, cobalt, copper, and nickel.

* * * * *